United States Patent
Nishimura

(10) Patent No.: US 9,905,556 B1
(45) Date of Patent: Feb. 27, 2018

(54) SEMICONDUCTOR DEVICE

(71) Applicant: FUJI ELECTRIC CO., LTD., Kanagawa (JP)

(72) Inventor: Takeyoshi Nishimura, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/636,670

(22) Filed: Jun. 29, 2017

(30) Foreign Application Priority Data

Aug. 10, 2016 (JP) .................................. 2016-157940

(51) Int. Cl.
  *H01L 29/78* (2006.01)
  *H01L 27/06* (2006.01)
  *H01L 29/423* (2006.01)
  *H01L 29/06* (2006.01)

(52) U.S. Cl.
  CPC ...... *H01L 27/0629* (2013.01); *H01L 29/0611* (2013.01); *H01L 29/0696* (2013.01); *H01L 29/4236* (2013.01)

(58) Field of Classification Search
  CPC ............. H01L 29/0611; H01L 29/0696; H01L 29/4236; H01L 29/66325; H01L 29/66272; H01L 29/7397
  See application file for complete search history.

(56) References Cited

U.S. PATENT DOCUMENTS

| 5,828,112 A * | 10/1998 | Yamaguchi ......... H01L 29/0696 257/337 |
| 6,060,744 A * | 5/2000 | Kuwahara ........... H01L 29/7395 257/197 |
| 2011/0012195 A1 | 1/2011 | Momota et al. |
| 2011/0198587 A1 | 8/2011 | Takeuchi |
| 2012/0007139 A1 | 1/2012 | Tanaka |
| 2012/0112241 A1 | 5/2012 | Matsushita |
| 2014/0084361 A1 | 3/2014 | Saito |

FOREIGN PATENT DOCUMENTS

| JP | H08-046193 A | 2/1996 |
| JP | 2010-219258 A | 9/2010 |
| JP | 2011-171478 A | 9/2011 |
| JP | 2013-055361 A | 3/2013 |
| JP | 2014-063907 A | 4/2014 |

* cited by examiner

*Primary Examiner* — Cuong Q Nguyen

(57) ABSTRACT

To suppress the reverse breakdown voltage decrease while separating a main body region from a current detecting region. To provide a semiconductor device comprising a semiconductor substrate, a main body region having one or more operation cells formed inside the semiconductor substrate, a current detecting region having one or more current detecting cells formed inside the semiconductor substrate, an intermediate region formed between the main body region and the current detecting region and inside the semiconductor substrate, an upper surface side electrode formed above at least part of the main body region, a current detecting electrode that is formed above at least part of the current detecting region and is separate from the upper surface side electrode, and an additional electrode that is formed above at least part of the intermediate region and is connected to either the upper surface side electrode or the current detecting electrode.

13 Claims, 17 Drawing Sheets

SEMICONDUCTOR DEVICE

The contents of the following Japanese patent application are incorporated herein by reference:
NO. 2016-157940 filed in JP on Aug. 10, 2016.

BACKGROUND

1. Technical Field

The present invention relates to semiconductor devices.

2. Related Art

Conventionally, in semiconductor devices such as power MOSFETs and IGBTs (Insulated Gate Bipolar Transistor), structures having a main body region to drive as an element and a current detecting region for detecting a current have been known (for example, see Patent Document 1).

Patent Document 1: Japanese Patent Application Publication No. 2010-219258

If a separate region is provided between the main body region and the current detecting region so as to separate these regions, the reverse breakdown voltage of a semiconductor device decreases in some cases.

SUMMARY

A first aspect of the present invention provides a semiconductor device including a semiconductor substrate. The semiconductor device may include a main body region including one or more operation cells formed inside the semiconductor substrate. The semiconductor device may include a current detecting region including one or more current detecting cells formed inside the semiconductor substrate. The semiconductor device may include an intermediate region formed between the main body region and the current detecting region and inside the semiconductor substrate. The semiconductor device may include an upper surface side electrode formed above at least part of the main body region. The semiconductor device may include a current detecting electrode that is formed above at least part of the current detecting region and is separate from the upper surface side electrode. The semiconductor device may include an additional electrode that is formed above at least part of the intermediate region and is connected to either the upper surface side electrode or the current detecting electrode.

The operation cell and the current detecting cell may be transistors that cause a current to flow in the depth direction of the semiconductor substrate. The intermediate region may include an intermediate cell that functions as a diode that causes a current to flow in the depth direction of the semiconductor substrate.

The additional electrode may be formed to be thinner than the upper surface side electrode and the current detecting electrode. The operation cell, the current detecting cell, and the intermediate cell may be formed at the same intervals.

Formed inside the semiconductor substrate may be the first conductivity-type base region and the second conductivity-type drift region formed below the base region. Formed inside the semiconductor substrate may be a plurality of trench portions that are formed to extend from the upper surface of the semiconductor substrate to below the base region and are arranged at the same intervals. A region between the respective trench portions functions as any one of the operation cell, the current detecting cell, or the intermediate cell. In the operation cell and the current detecting cell, the second conductivity-type high concentration region may be formed above the base region. In the intermediate cell, the high concentration region may not be formed above the base region.

The current detecting electrode may be formed also above part of the intermediate cell. The upper surface side electrode may be formed also above part of the intermediate cell. The number of the intermediate cells formed below the current detecting electrode may be equal to or larger than the number of the intermediate cells formed below the upper surface side electrode.

The additional electrode may be connected to the current detecting electrode. The additional electrode may be formed below the entire current detecting electrode. The additional electrode may be connected to the upper surface side electrode. The additional electrode may be formed below part of the upper surface side electrode. The additional electrode may have an opening portion.

Inside the semiconductor substrate, the first conductivity-type base region and the second conductivity-type drift region formed below the base region may be formed. Formed inside the semiconductor substrate may be the plurality of trench portions that are formed to extend from the upper surface of the semiconductor substrate to below the base region and are arranged at the same intervals. Formed inside the semiconductor substrate may be the first conductivity-type column and the second conductivity-type column that are alternately arranged inside the drift region.

A second aspect of the present invention is to provide a semiconductor device including a semiconductor substrate. The semiconductor device may include a main body region including one or more operation cells formed inside the semiconductor substrate. The semiconductor device may include a current detecting region including one or more current detecting cells formed inside the semiconductor substrate. The semiconductor device may include an intermediate region including one or more intermediate cells formed between the main body region and the current detecting region and inside the semiconductor substrate. The semiconductor device may include an upper surface side electrode formed above at least part of the main body region. The semiconductor device may include a current detecting electrode that is formed above at least part of the current detecting region and is separate from the upper surface side electrode. The operation cell, the current detecting cell, and the intermediate cell may be arranged at the same intervals. The operation cell and the current detecting cell may be transistors that cause a current to flow in the depth direction of the semiconductor substrate. The intermediate cell may be a diode that causes a current to flow in the depth direction of the semiconductor substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims. Also, all the combinations of the features described in the embodiment(s) are not necessarily essential to means provided by aspects of the invention.

One side in a direction parallel to the depth direction of a semiconductor substrate is herein referred to as the 'upper' side, and the other side is referred to as the 'lower' side. Out of two principal surfaces of a substrate, a layer, or some other member, one of the surfaces is referred to as the upper surface, and the other surface is referred to as the lower surface. The 'upper' and 'lower' directions are not limited to the gravity direction.

Although the terms 'source' and 'drain' are used herein, the semiconductor device is not limited to a MOSFET. The 'emitter' and 'collector' in a bipolar transistor of IGBT or the like may also be included in the scope of the terms 'source' and 'drain' used herein.

Although in each embodiment, the first conductivity-type and the second conductivity-type are illustrated as a p-type and an n-type, respectively, the conductivity-types of the substrate, the layer, the region, or the like may each be of opposite polarity.

Figure 1:
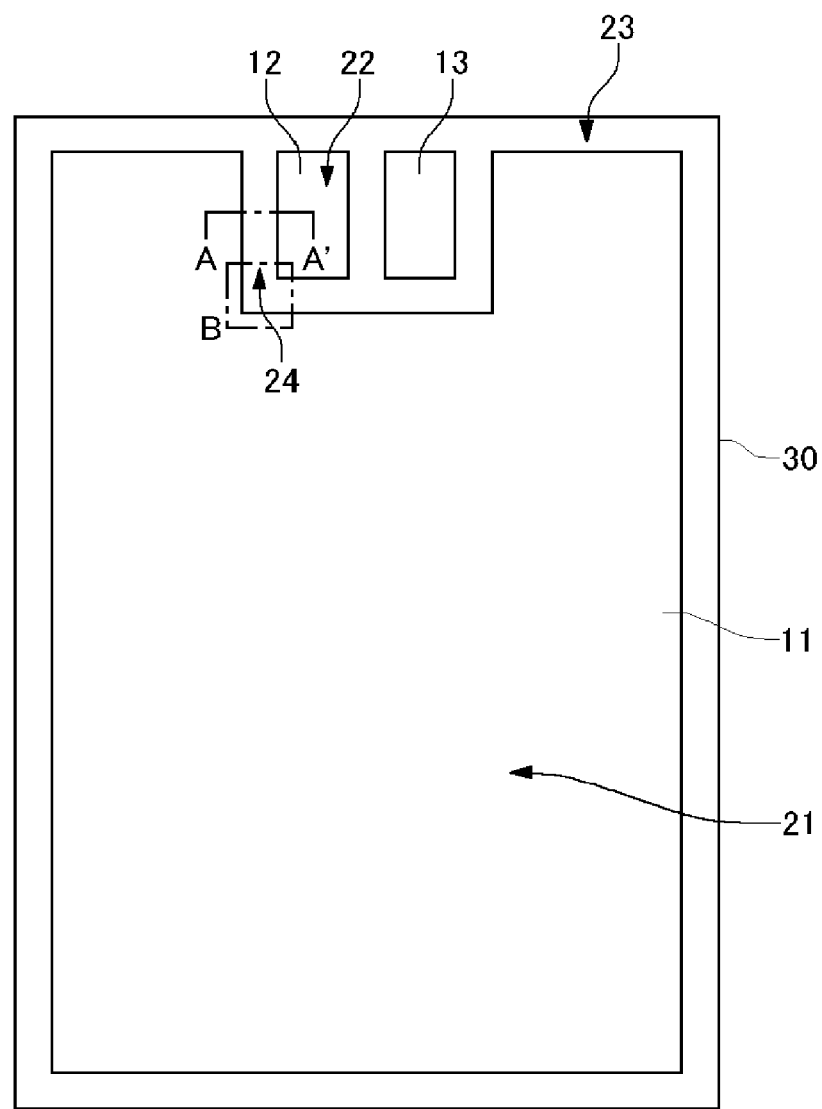
FIG. 1 is a schematic view of an upper surface of a semiconductor device 100 according to an embodiment of the present invention.

FIG. 1 is a schematic view of an upper surface of a semiconductor device 100 according to an embodiment of the present invention. The semiconductor device 100 includes a semiconductor substrate 30. The semiconductor substrate 30 may be a silicon substrate or a compound-semiconductor substrate formed of a nitride semiconductor, silicon carbide semiconductor, or the like. A source electrode 11 and a current detecting electrode 12 are formed above the upper surface of the semiconductor substrate 30. The source electrode 11 is one example of the upper surface side electrode. A gate electrode 13 may be further formed above the upper surface of the semiconductor substrate 30.

Figure 2:
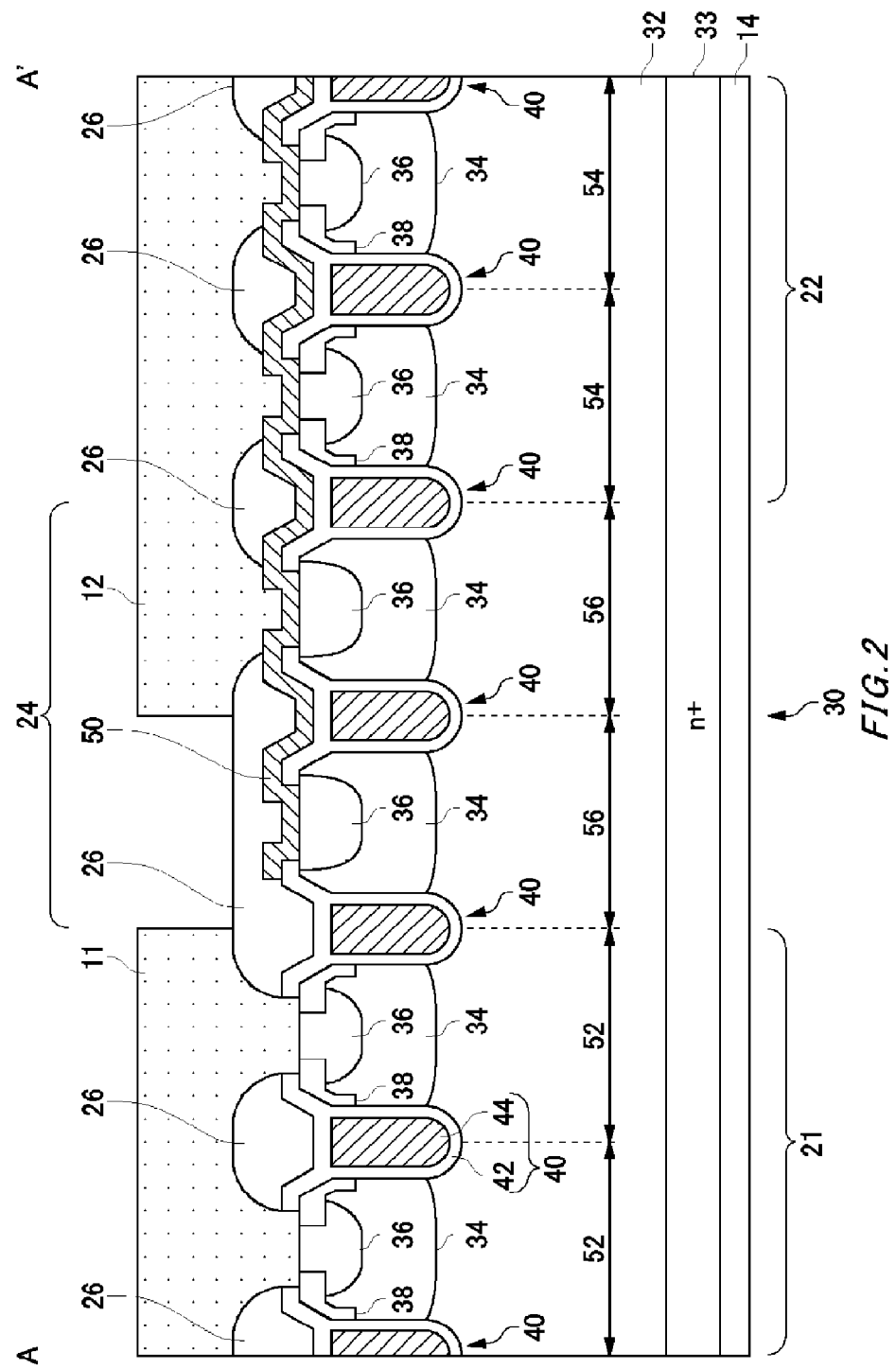
FIG. 2 shows the first embodiment of the cross section A-A' in FIG. 1.

As one example, the source electrode 11, the current detecting electrode 12, and the gate electrode 13 are formed of metal material such as metal including aluminum. The source electrode 11, the current detecting electrode 12, and the gate electrode 13 are provided to be separate from each other. The semiconductor device 100 of the present example is a vertical device in which the main current flows in the depth direction of the semiconductor substrate 30. A drain region 33 and a drain electrode 14 as shown in FIG. 2 are formed in the lower surface of the semiconductor substrate 30 of the present example.

A main body region 21, a current detecting region 22, and an intermediate region 24 are formed inside the semiconductor substrate 30. The main body region 21 is a region where the main current for the semiconductor device 100 flows. The main current that flows into the main body region 21 flows to the outside via the source electrode 11. The source electrode 11 is formed above at least part of the main body region 21.

The current detecting region 22 is a region where a detection target current flows. The detection target current flows via the current detecting electrode 12 into an external current detecting device. The current detecting electrode 12 is formed above at least part of the current detecting region 22. On the upper surface of the semiconductor substrate 30, the area covered by the current detecting electrode 12 is smaller than the area covered by the source electrode 11.

The current detecting device detects a current value of the detection target current. The current detecting device may control the semiconductor device 100 based on the detected current value. For example, the current detecting device controls the semiconductor device 100 to be turned off if the detected current value exceeds a predetermined threshold value.

The intermediate region 24 is a region between the main body region 21 and the current detecting region 22. By providing the intermediate region 24, the main body region 21 is separated from the current detecting region 22. The intermediate region 24 may operate differently from the main body region 21 and the current detecting region 22. As one example, the main body region 21 and the current detecting region 22 each have a transistor that is controlled by voltage applied to the gate electrode 13. On the other hand, the intermediate region 24 is not controlled by voltage applied to the gate electrode 13.

An edge termination structure region 23 is formed along the outer periphery of the semiconductor substrate 30. The edge termination structure region 23 is formed outside the main body region 21, the current detecting region 22, and the intermediate region 24. An edge termination structure such as a guard ring or a field plate is formed in the edge termination structure region 23.

First Embodiment

FIG. 2 shows the first embodiment of the cross section A-A' in FIG. 1. Each configuration shown in FIG. 2 may be formed to extend in a direction perpendicular to the sheet surface of FIG. 2. In FIG. 2, as one example, on the lower surface side of the semiconductor device 100, the drain region 33 doped with $n^+$-type impurities are formed, and the drain electrode 14 is formed on the lower surface side of the drain region 33. Note that, as another example, a collector region doped with $p^+$ or $p^-$-type impurities may be formed, and a collector electrode may be formed on the lower surface side of the collector region. Also, on the lower surface side of the semiconductor device 100, an n-type region doped with n-type impurities may be formed. Furthermore, formed on the lower surface side of the n-type region may be the collector region where p-type region doped with p-type impurities is formed, and the collector electrode may be formed on the lower surface side of the collector region. Also, on the lower surface side of the semiconductor device 100 such as a Reverse Conducting Insulated Gate Bipolar Transistor, the collector region may be formed, having both of the p-type region doped with p-type impurities and the n-type region doped with n-type impurities. The collector electrode may be formed on the lower surface side of the collector region.

One or more operation cells 52 where a main current flows are formed in the main body region 21. One or more current detecting cells 54 where a detection target current flows are formed in the current detecting region 22. The operation cell 52 and the current detecting cell 54 of the present example function as parts of transistors that switch whether or not to cause a current to flow in a depth direction of the semiconductor substrate 30. The operation cell 52 and the current detecting cell 54 preferably have the same structure and the same impurity concentration.

On the upper surface of the semiconductor substrate 30, the area occupied by the current detecting region 22 is smaller than the area occupied by the main body region 21. The area occupied by the current detecting region 22 may be equal to or less than one tenth, or may also be equal to or less than one hundredth, of the area occupied by the main body region 21.

The intermediate region 24 is formed between the main body region 21 and the current detecting region 22 and inside the semiconductor substrate 30. In the intermediate region 24, the operation cell 52 and the current detecting cell 54 are not formed. In the present example, a region that operates as a transistor is not formed in the intermediate region 24. Formed in the intermediate region 24 of the present example is an intermediate cell 56 that functions as a diode that causes a current to flow in the depth direction of the semiconductor substrate 30.

In the semiconductor substrate 30 of the present example, the n$^+$-type drain region 33 and an n$^-$-type drift region 32 are formed in this order from the lower surface side in the main body region 21, the current detecting region 22, and the intermediate region 24. Also, a p-type base region is formed in the surface layer of the drift region 32. Also, formed in the main body region 21, the current detecting region 22, and the intermediate region 24 is a trench portion 40 that penetrates the base region 34 and extends from the upper surface of the semiconductor substrate 30 to below the base region 34 to reach the drift region 32.

A mesa region sandwiched between the respective trench portions 40 functions as any one of the operation cell 52, the current detecting cell 54, or the intermediate cell 56. In the present example, the center of width of the trench portion 40 in the lateral direction serves as the border between the respective cells. In the operation cell 52 and the current detecting cell 54 of the present example, an n$^+$-type source region 38 is formed above the base region 34. The source region 38 is doped with impurities at higher concentration than the drift region 32. The source region 38 is one example of a high concentration region. Consequently, the operation cell 52 and the current detecting cell 54 function as transistors. In the present example, out of the cells that function as transistors, a cell formed below the source electrode 11 is used as the operation cell 52 while a cell formed below the current detecting electrode 12 is used as the current detecting cell 54.

In contrast, in the intermediate cell 56 of the present example, the source region 38 is not formed above the base region 34. The intermediate cell 56 functions as a pn-junction diode between the base region 34 and the drift region 32. The intermediate region 24 separates the main body region 21 from the current detecting region 22, thereby allowing highly precise detection of a detection target current.

Furthermore, a p$^+$-region 36 of p$^+$-type may be formed in a region exposed to the upper surface of the semiconductor substrate 30 in the operation cell 52, the current detecting cell 54, and the intermediate cell 56. The p$^+$-region 36 is doped with impurities at higher concentration than the base region 34. This reduces contact resistance between each cell and an electrode such as the source electrode 11, and thereby operation of a parasitic bipolar transistor in the transistor cell can be suppressed.

Formed above at least part of the intermediate region 24 is an additional electrode 50 electrically connected to either the source electrode 11 or the current detecting electrode 12. In the example of FIG. 2, the additional electrode 50 is connected to the current detecting electrode 12. The additional electrode 50 is electrically connected to the intermediate cell 56 in the intermediate region 24. The additional electrode 50 is formed of impurities-doped polysilicon or a conductive material such as high melting point metal. As a more concrete example, the additional electrode 50 is formed of conductive material such as tungsten, molybdenum, tantalum, and titanium.

It is preferable that the additional electrode 50 of the present example is electrically connected to all of the intermediate cells 56 in the intermediate region 24. The additional electrode 50 of another example may be electrically connected to part of the intermediate cells 56 in the intermediate region 24. As one example, the additional electrode 50 may be electrically connected to the intermediate cell 56 at the side of the current detecting region 22 while not being electrically connected to one or more of the intermediate cells 56 adjacent to the main body region 21.

Also in the intermediate region 24, current flows from the lower surface side (drain side) of the semiconductor substrate 30 to the upper surface side (source side). When none of the source electrode 11, the current detecting electrode 12, and the additional electrode 50 is connected to the intermediate cell 56, current that flows from the lower side of the intermediate region 24 flows to the main body region 21 and the current detecting region 22.

The area of the current detecting region 22 is considerably smaller than the area of the main body region 21. Also, the area of the intermediate region 24 has a size that is not negligible relative to the area of the current detecting region 22. For this reason, when current undesirably flows to the current detecting region 22 from the lower side of the intermediate region 24, the amount of current increase per unit area of the current detecting region 22 becomes greater. This leaves more possibilities for the current detecting region 22 to get destroyed, and thereby the reverse breakdown voltage undesirably decreases.

The source electrode 11 or the current detecting electrode 12 may be connected to the intermediate cell 56, and current of the intermediate region 24 may be caused to flow to the source electrode 11 or the current detecting electrode 12 via the intermediate cell 56. However, the source electrode 11 and the current detecting electrode 12 are formed of relatively thick metal for the purpose of processing such as wire bonding, and fine processing is relatively difficult in some cases. For this reason, when the cell pitch gets small as a result of miniaturizing the semiconductor device 100, it becomes difficult to achieve both separation between the source electrode 11 and the current detecting electrode 12 and connection of any of the electrodes to the intermediate cell 56.

In contrast, in the semiconductor device 100, the additional electrode 50 is connected to the intermediate cell 56. The material quality or the thickness of the additional electrode 50 allows the additional electrode 50 to be more finely processed than the material quality or the thickness of the source electrode 11 and the current detecting electrode 12 allow them. For example, the additional electrode 50 is formed of polysilicon, and the source electrode 11 and the current detecting electrode 12 are formed of metal. Also, the additional electrode 50 may be formed to be thinner than the source electrode 11 and the current detecting electrode 12.

Connecting the additional electrode 50 to the intermediate cell 56 allows current of the intermediate region 24 to flow to the additional electrode 50 via intermediate cell 56. This makes it possible to suppress current of the intermediate region 24 flowing to the current detecting cell 54, and thereby the reverse breakdown voltage can be maintained. Also, forming the additional electrode 50 by using polysilicon or the like allows the additional electrode 50 to be easily processed even when the semiconductor device 100 is miniaturized.

The additional electrode 50 may be formed below the entire current detecting electrode 12. This allows current of the intermediate region 24 to flow and spread to the entire current detecting electrode 12. Also, the resistance value of a path where a detection target current flows can be adjusted by adjusting a resistance value of the additional electrode 50 provided below the entire current detecting electrode 12. An interlayer insulating film 26 may be provided in part of a region between the additional electrode 50 and the current detecting electrode 12.

The trench portion 40 of the present example has a trench that extends from the upper surface of the semiconductor substrate 30 and reaches the drift region 32, the gate insulating film 42 formed on the inner wall of the trench, and the electrode unit 44 provided in the trench and covered with the gate insulating film 42.

As one example, the gate insulating film 42 is an oxidized film formed by thermally oxidizing the semiconductor substrate 30 that is exposed to the inner wall of the trench. As one example, the electrode unit 44 is formed of polysilicon and the like doped with impurities. The electrode unit 44 of the present example is electrically connected to the gate electrode 13 shown in FIG. 1. A channel is formed in the base region 34 facing the electrode unit 44, corresponding to a gate voltage applied to the electrode unit 44. Accordingly, current flows between the drift region 32 and the source region 38 in the operation cell 52 and the current detecting cell 54.

When the semiconductor device 100 includes an IGBT, part of the electrode units 44 may be electrically connected to the source electrode 11 (an emitter electrode in the IGBT). The trench portion 40 connected to the source electrode 11 functions as a dummy trench. This produces carriers injection enhancement effect (IE effect), thereby lowering ON state voltage.

The respective trench portions 40 are arranged at the same intervals at the cross section. In other words, the operation cell 52, the current detecting cell 54, and the intermediate cell 56 are formed at the same intervals. The plurality of trench portions 40 may be formed to extend in stripe shapes in the direction perpendicular to the cross section.

In the semiconductor device 100 of the present example, the respective cells are arranged at the same intervals in the main body region 21, the current detecting region 22, and the intermediate region 24. Moreover, in the semiconductor device 100 of the present example, without an edge termination structure such as a field plate provided in the intermediate region 24, the intermediate cell 56 that functions as a diode separates the main body region 21 from the current detecting region 22. This eliminates or reduces ineffective regions and allows a greater current to flow.

Part of the gate insulating film 42 is formed on the upper surface of the semiconductor substrate 30. However, the $p^+$-region 36 and the source region 38 in each cell are at least partially not covered with the gate insulating film 42.

The additional electrode 50 of the present example is formed on the upper surface of the semiconductor substrate 30 and the upper surface of the gate insulating film 42 in the intermediate region 24 and the current detecting region 22. The additional electrode 50 is electrically connected to the $p^+$-region 36 and the source region 38 in each cell.

The interlayer insulating film 26 is formed on the upper surface of the semiconductor substrate 30, the upper surface of the gate insulating film 42, and the upper surface of the additional electrode 50. However, an opening is formed in the interlayer insulating film 26 so that the $p^+$-region 36 and the source region 38 in each of the cells are exposed. Also, an opening is formed in the interlayer insulating film 26 between the additional electrode 50 and the current detecting electrode 12 so that the additional electrode 50 is exposed. As one example, the opening is formed above the intermediate cell 56 and the current detecting cell 54. These openings are filled with the source electrode 11 or the current detecting electrode 12.

Moreover, it is preferable that the interlayer insulating film 26 is continuously formed from below an end of the source electrode 11 to below an end of the current detecting electrode 12 facing the source electrode 11. The additional electrode 50 terminates below the continuously formed interlayer insulating film 26. Consequently, it is possible to prevent undesirable connection of both the source electrode 11 and the current detecting electrode 12 to the additional electrode 50.

Figure 3:
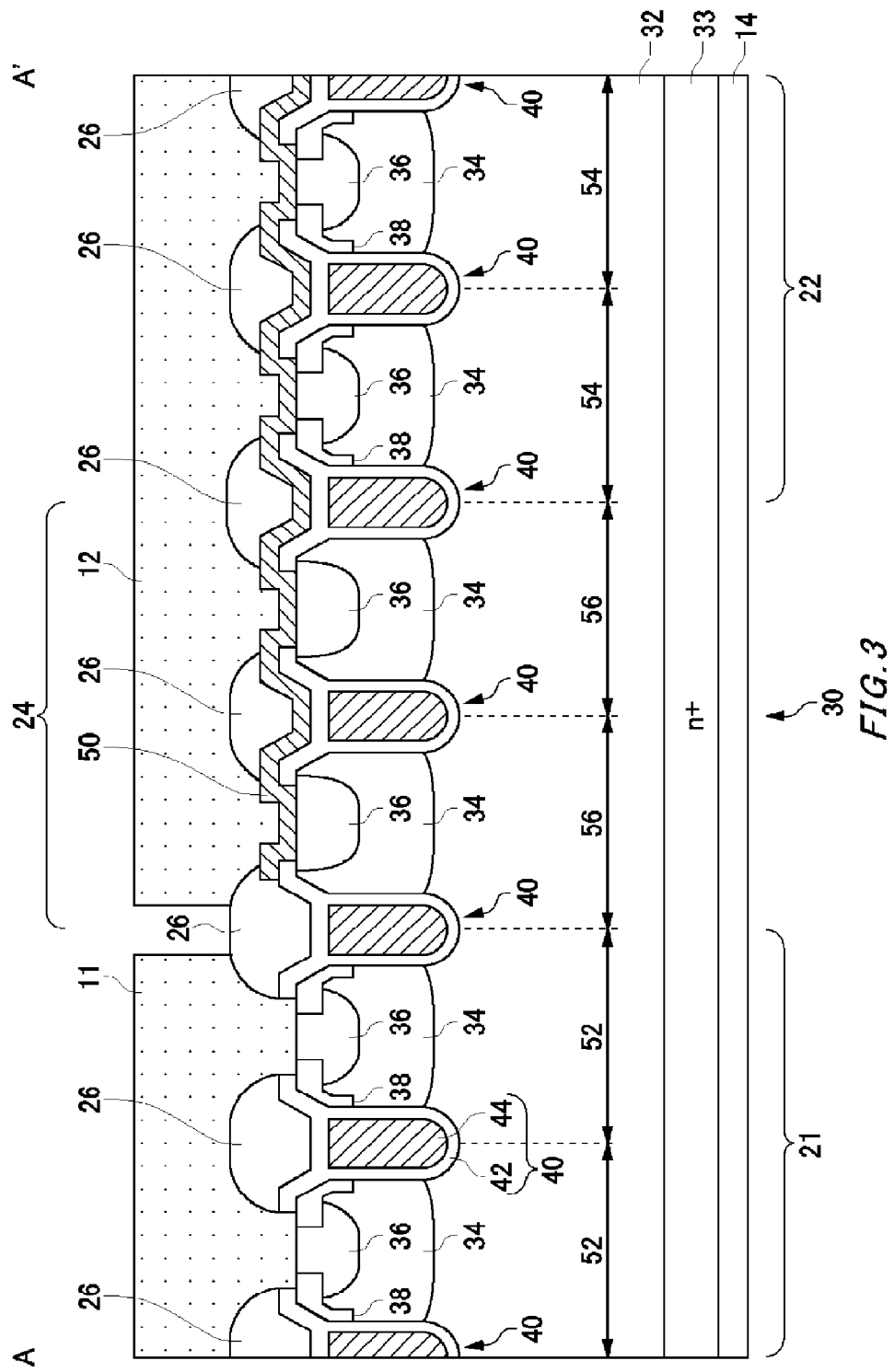
FIG. 3 shows another example of the cross section A-A' in FIG. 1.

FIG. 3 shows another example of the cross section A-A' in FIG. 1. In the present example, the current detecting electrode 12 extends in the intermediate region 24 to above the intermediate cell 56 adjacent to the main body region 21. The additional electrode 50 also extends to above the intermediate cell 56 adjacent to the main body region 21. Furthermore, an opening is formed in the interlayer insulating film 26 above the intermediate cell 56 adjacent to the main body region 21.

The structure of the present example may be adopted if it is possible to perform fine processing with respect to the source electrode 11 and the current detecting electrode 12. By providing the additional electrode 50 also in this structure, the additional electrode 50 allows current to be extracted from the intermediate cell 56 even when the location of the end of the current detecting electrode 12 is misaligned, which then undesirably separates the intermediate cell 56 from the current detecting electrode 12 that is supposed to be connected thereto.

Figure 4:
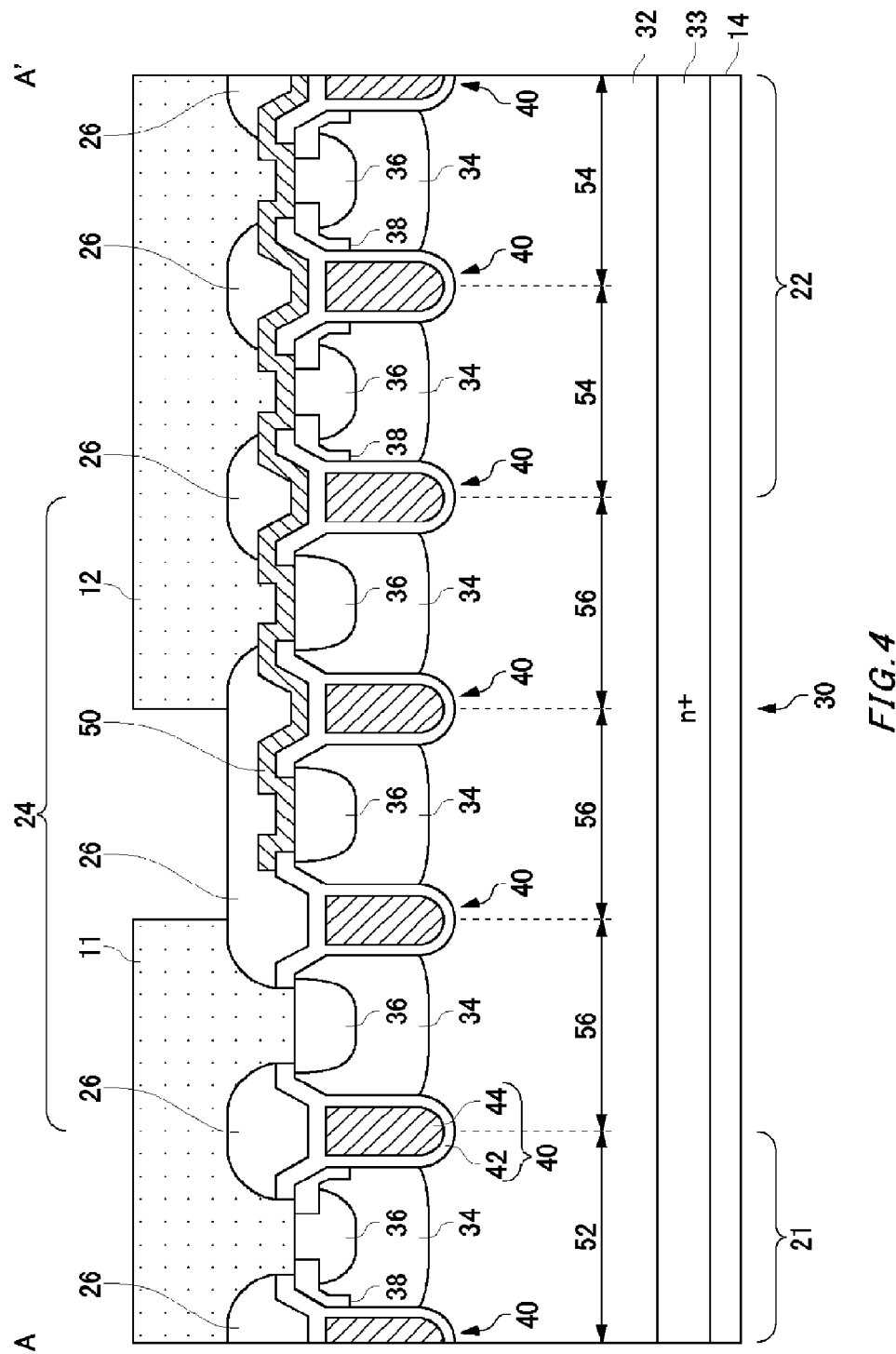
FIG. 4 shows another example of the cross section A-A' in FIG. 1.

FIG. 4 shows another example of the cross section A-A' in FIG. 1. In the present example, the source electrode 11 is formed also above part of the intermediate cells 56. In the example of FIG. 4, the source electrode 11 is connected to one of the intermediate cells 56 that is adjacent to the main body region 21. Similarly, the current detecting electrode 12 is formed also above part of the intermediate cells 56. In the example of FIG. 4, the current detecting electrode 12 is connected to one of the intermediate cells 56 that is adjacent to the current detecting region 22.

The number of intermediate cells 56 may be increased by forming the intermediate cell 56 also below the source electrode 11 or the current detecting electrode 12, which thereby makes it possible to further separate the main body region 21 from the current detecting region 22. Also, connecting the intermediate cell 56 formed below each electrode thereto allows current to be extracted from the intermediate cell 56.

The number of the intermediate cells 56 formed below the current detecting electrode 12 may be equal to or greater than the number of the intermediate cells 56 formed below the source electrode 11. This allows more operation cells 52 to be formed below the source electrode 11.

Figure 5:
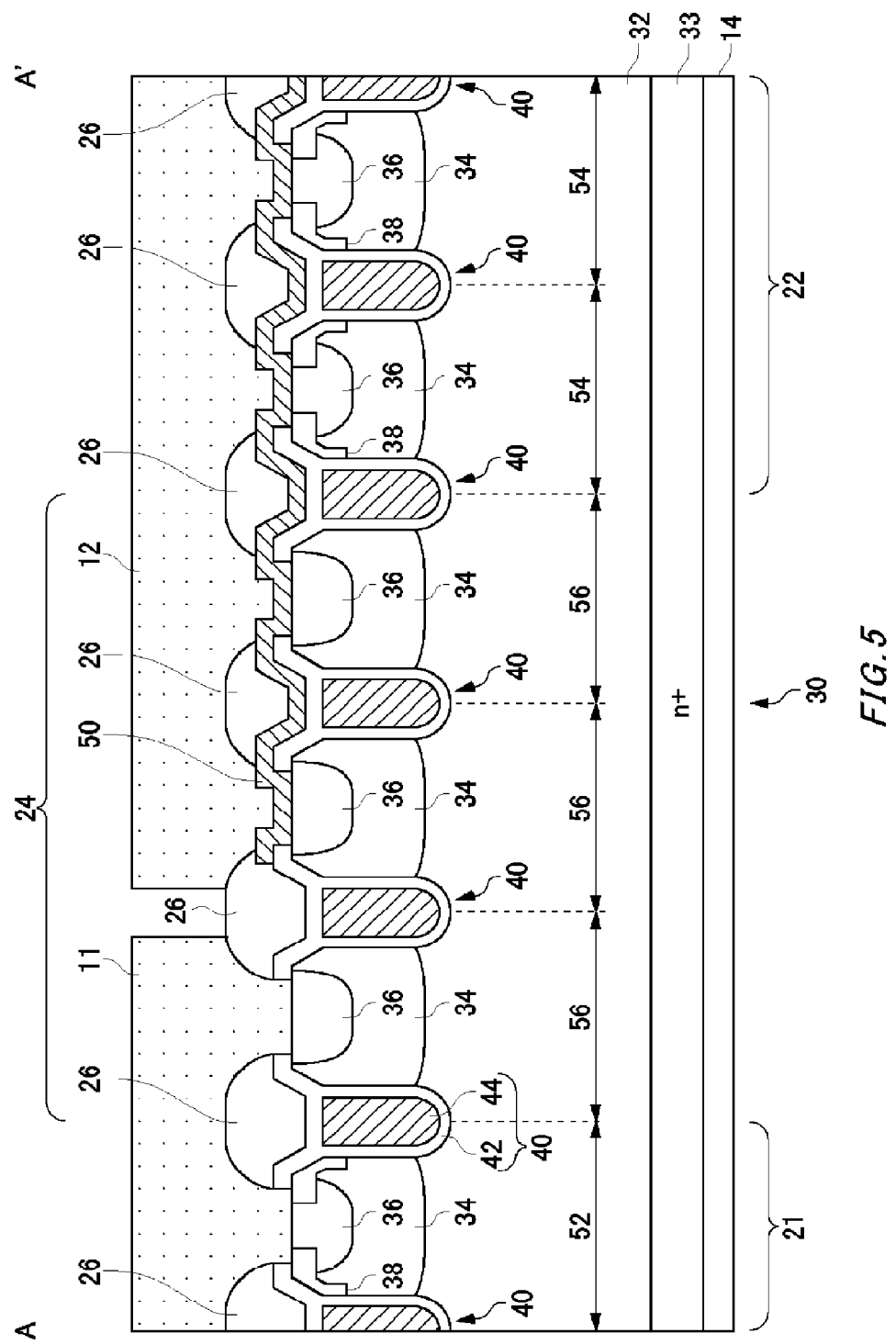
FIG. 5 shows another example of the cross section A-A' in FIG. 1.

FIG. 5 shows another example of the cross section A-A' in FIG. 1. In the present example, every intermediate cell 56 is arranged below either the source electrode 11 or the current detecting electrode 12. However, the number of the intermediate cells 56 formed below the current detecting electrode 12 is greater than the number of the intermediate cells 56 formed below the source electrode 11. The remaining structure may be the same as the semiconductor device 100 according to the example of FIG. 4.

Figure 6:
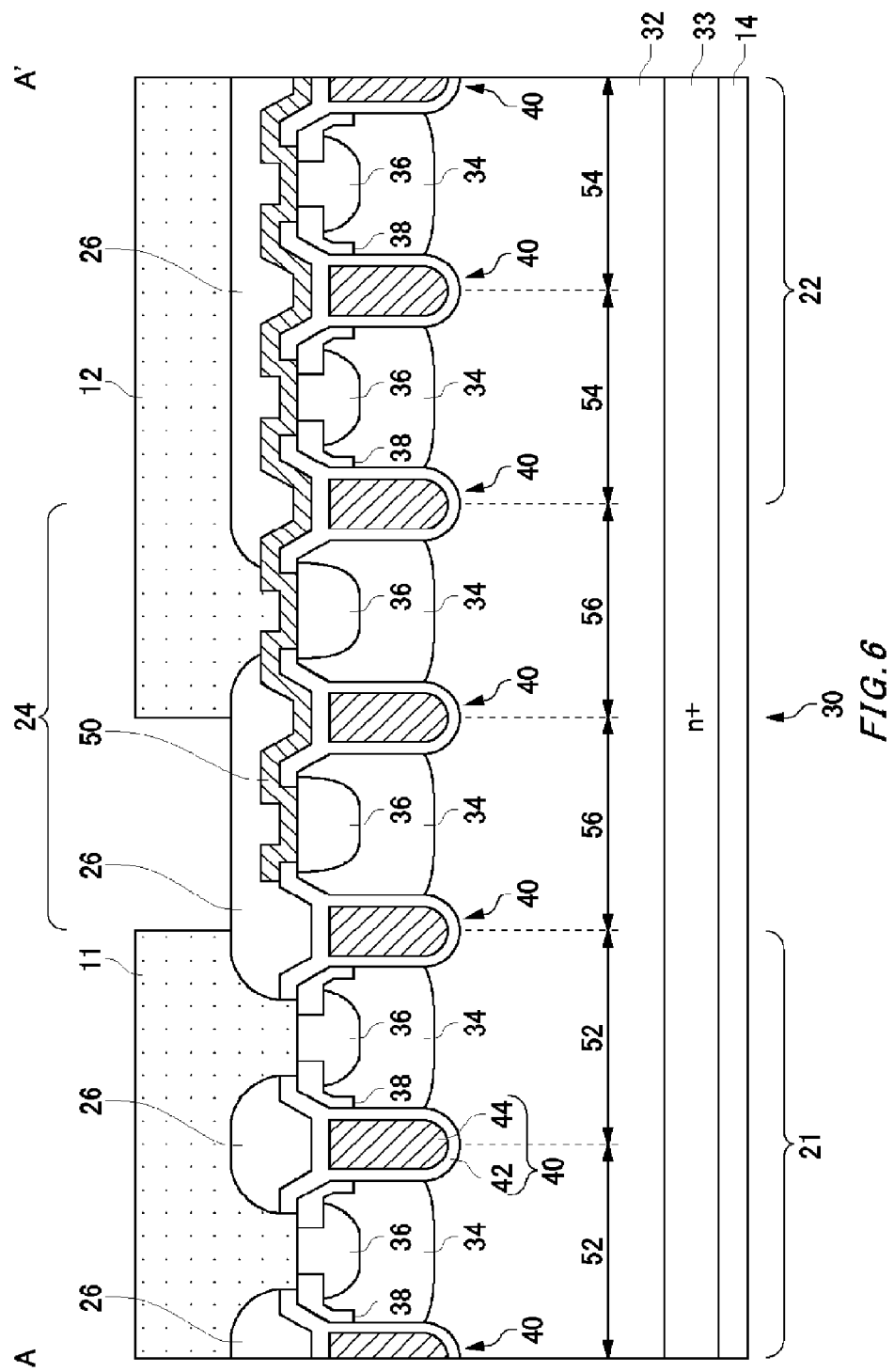
FIG. 6 shows another example of the cross section A-A' in FIG. 1.

FIG. 6 shows another example of the cross section A-A' in FIG. 1. In the present example, the interlayer insulating film 26 is continuously formed across a plurality of current detecting cells 54. However, an opening may be formed in the interlayer insulating film 26 above one of the current detecting cells 54. Adjusting the shape of the interlayer insulating film 26 in this way can adjust the contact area between the current detecting electrode 12 and the additional electrode 50. This then enables adjustment of the resistance value of the path where the detection target current flows.

Accordingly, the detection target current can be adjusted to have a current value that is suitable to input to an external processing circuit. Also, the current ratio between the main current that flows into the source electrode 11 and the detection target current that flows into the current detecting electrode 12 can be adjusted.

Figure 7:
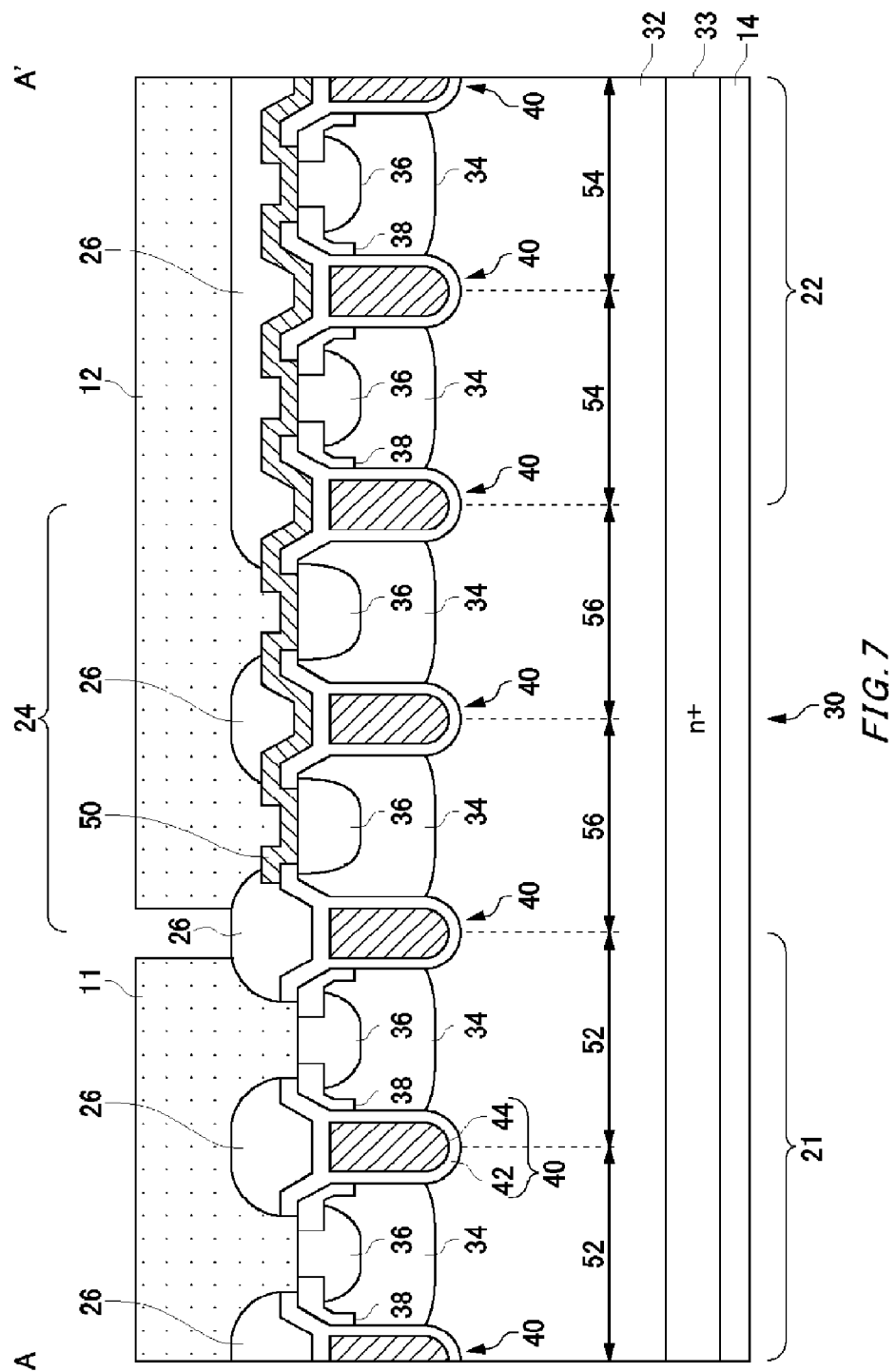
FIG. 7 shows another example of the cross section A-A' in FIG. 1.

FIG. 7 shows another example of the cross section A-A' in FIG. 1. In the present example, as in the case with the example in FIG. 6, the interlayer insulating film 26 is continuously formed across the plurality of the current detecting cells 54. Also, as in the case with the examples in FIG. 3 and FIG. 5, the current detecting electrode 12 extends to near the source electrode 11.

Figure 8:
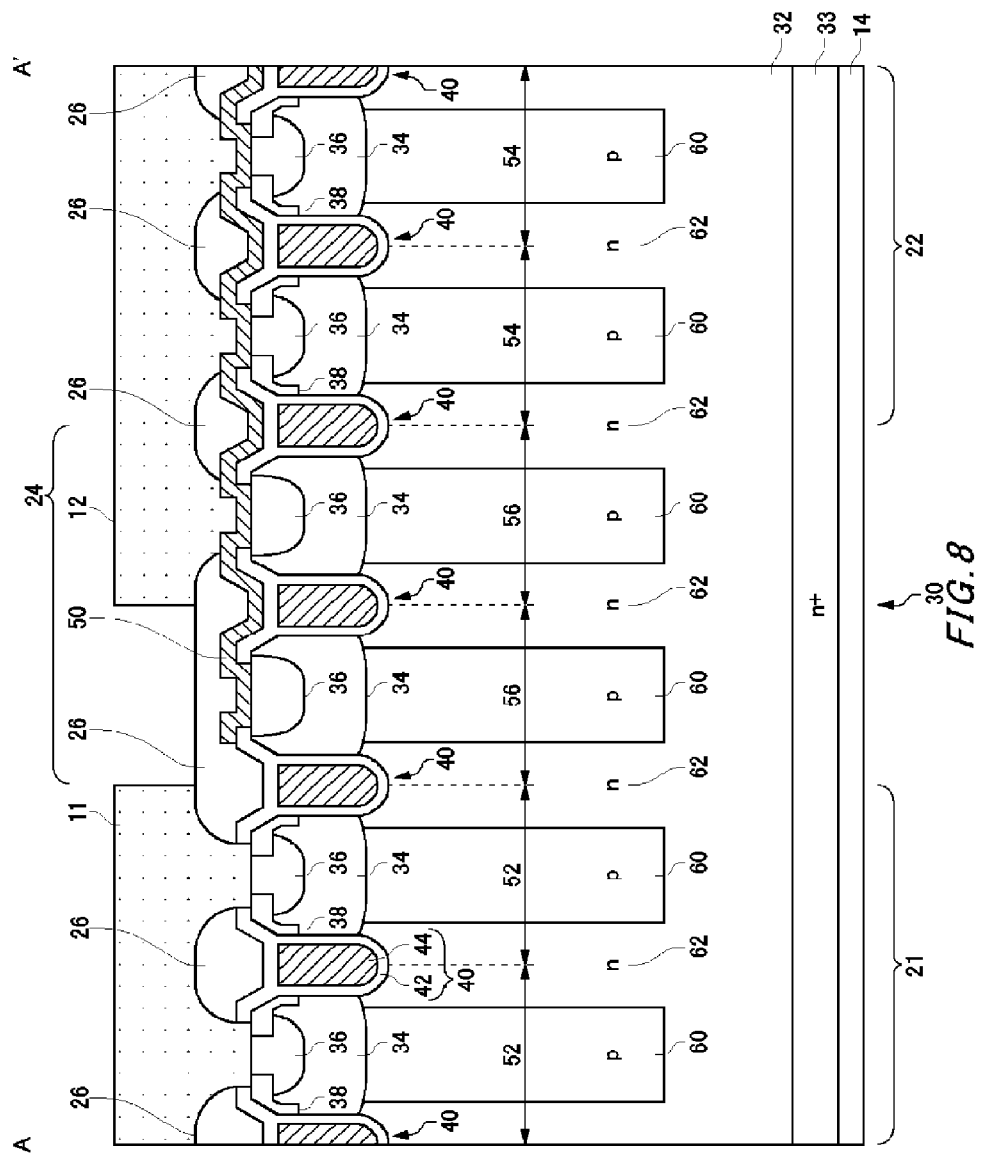
FIG. 8 shows another example of the cross section A-A' in FIG. 1.

FIG. 8 shows another example of the cross section A-A' in FIG. 1. In addition to any one of the structures described in FIG. 1 to FIG. 7, the semiconductor device 100 of the present example further includes a p-type column 60 and an n-type column 62. FIG. 8 shows a structure that is equivalent to the structure shown in FIG. 2 but additionally has the column 60 and the column 62.

The column 60 and the column 62 are alternately arranged inside the drift region 32. The impurity concentration and width of the column 60 and the column 62 are adjusted so that a superjunction can be formed. Such a structure allows a depletion layer to spread in the lateral direction from the border between the column 60 and the column 62, so that the high reverse breakdown voltage can be maintained even when the impurity concentration is increased in the n-type region (the n-type column 62) and ON-state resistance is lowered.

In the present example, the column 60 is formed to protrude downward from the lower surface of the base region 34 in each cell. The drift region 32 between the columns 60 functions as the column 62. The intervals between the respective columns 60 are the same as the intervals between the respective cells. The column 60 is formed for each of the operation cell 52, current detecting cell 54, and the intermediate cell 56. In the semiconductor device 100, the cells are arranged at the same intervals in the main body region 21, the current detecting region 22, and the intermediate region 24. Consequently, superjunction of the same structure is formed in the main body region 21, current detecting region 22, and the intermediate region 24. The impurity concentration of the column is the same in the main body region 21, the current detecting region 22 and the intermediate region 24.

Such a structure allows the column 60 and the column 62 of superjunction to be arranged at equal intervals while providing the intermediate region 24 that separates the main body region 21 from the current detecting region 22. Accordingly, the charge balance between the p-type and n-type column impurities in the superjunction can easily be kept, so that the reverse breakdown voltage can be maintained.

Figure 9:
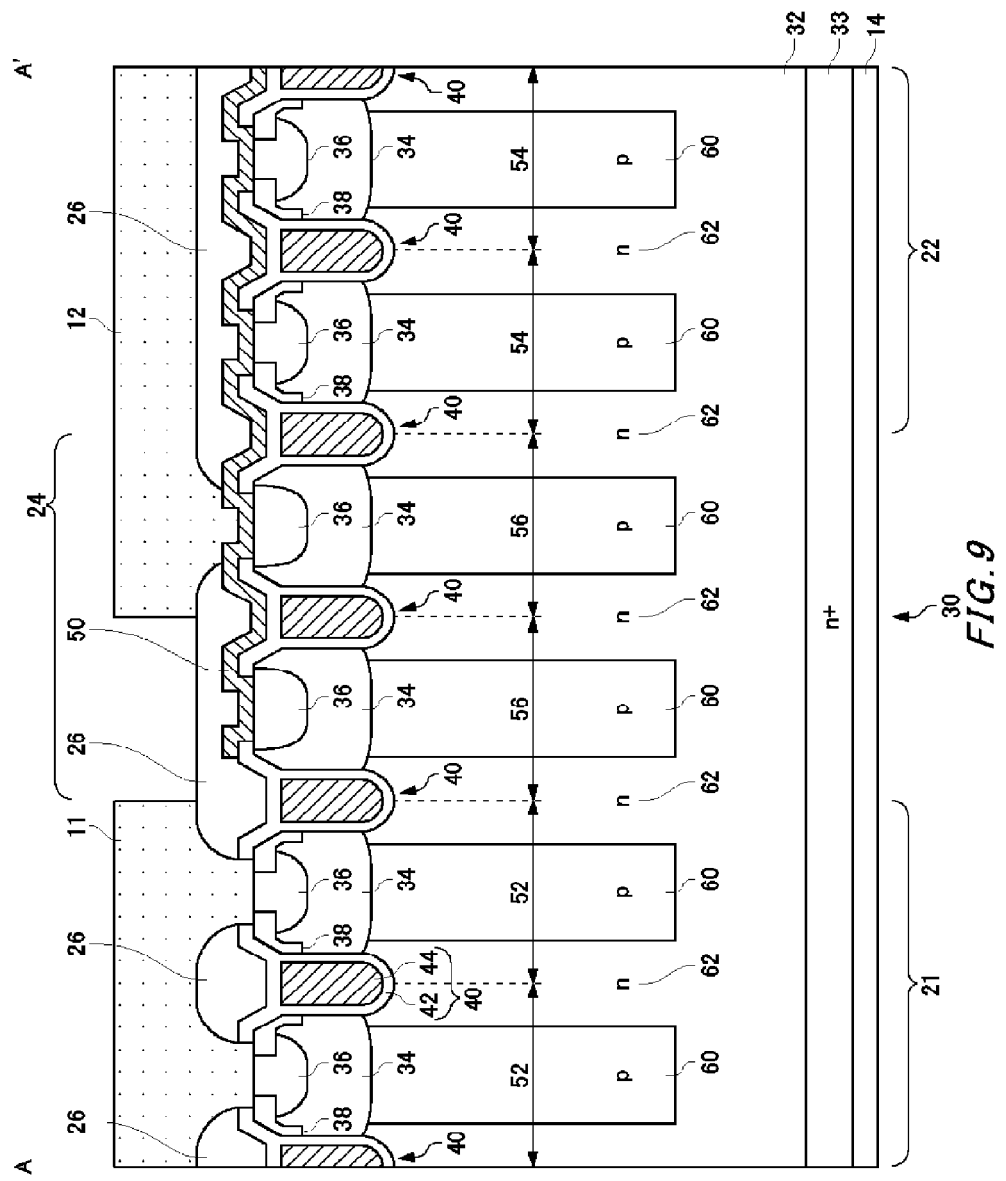
FIG. 9 shows another example of the cross section A-A' in FIG. 1.

FIG. 9 shows another example of the cross section A-A' in FIG. 1. The semiconductor device 100 of the present example has a structure that is equivalent to the structure shown in FIG. 6 but additionally has the column 60 and the column 62. Such a structure also allows keeping the charge balance of impurities in the p-type and n-type columns in superjunction while separating the main body region 21 from the current detecting region 22.

Second Embodiment

Figure 10:
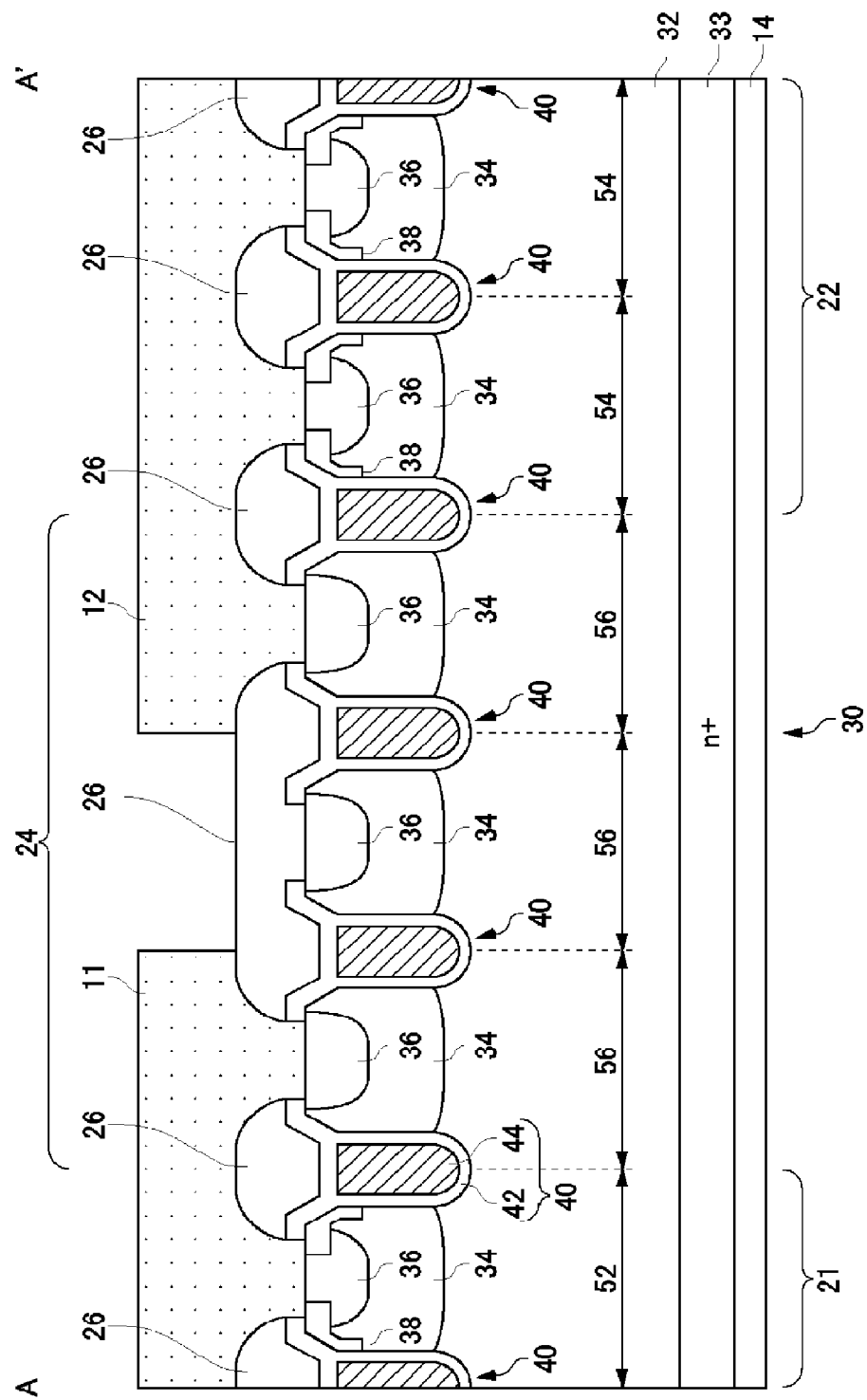
FIG. 10 shows the second embodiment of the cross section A-A' in FIG. 1.

FIG. 10 shows the second embodiment of the cross section A-A' in FIG. 1. The semiconductor device 100 of the present embodiment has a structure that is equivalent to the structure shown in any one of FIG. 1 to FIG. 9 but the additional electrode 50 is removed therefrom. FIG. 10 shows a structure equivalent to the structure shown in FIG. 4 but the additional electrode 50 is removed therefrom.

In the semiconductor device 100 of the present example, the operation cell 52, the current detecting cell 54, and the intermediate cell 56 are arranged at equal intervals. Also, at least part of the intermediate cells 56 is connected to either the source electrode 11 or the current detecting electrode 12. In the example of FIG. 10, both the source electrode 11 and the current detecting electrode 12 are connected to at least one or more intermediate cells 56.

The semiconductor device 100 of the present example allows the current flowing into the intermediate region 24 to be extracted via the intermediate cells 56 while separating the main body region 21 from the current detecting region 22 without providing an ineffective region. Consequently, the reverse breakdown voltage decrease can be suppressed in the current detecting region 22.

Figure 11:
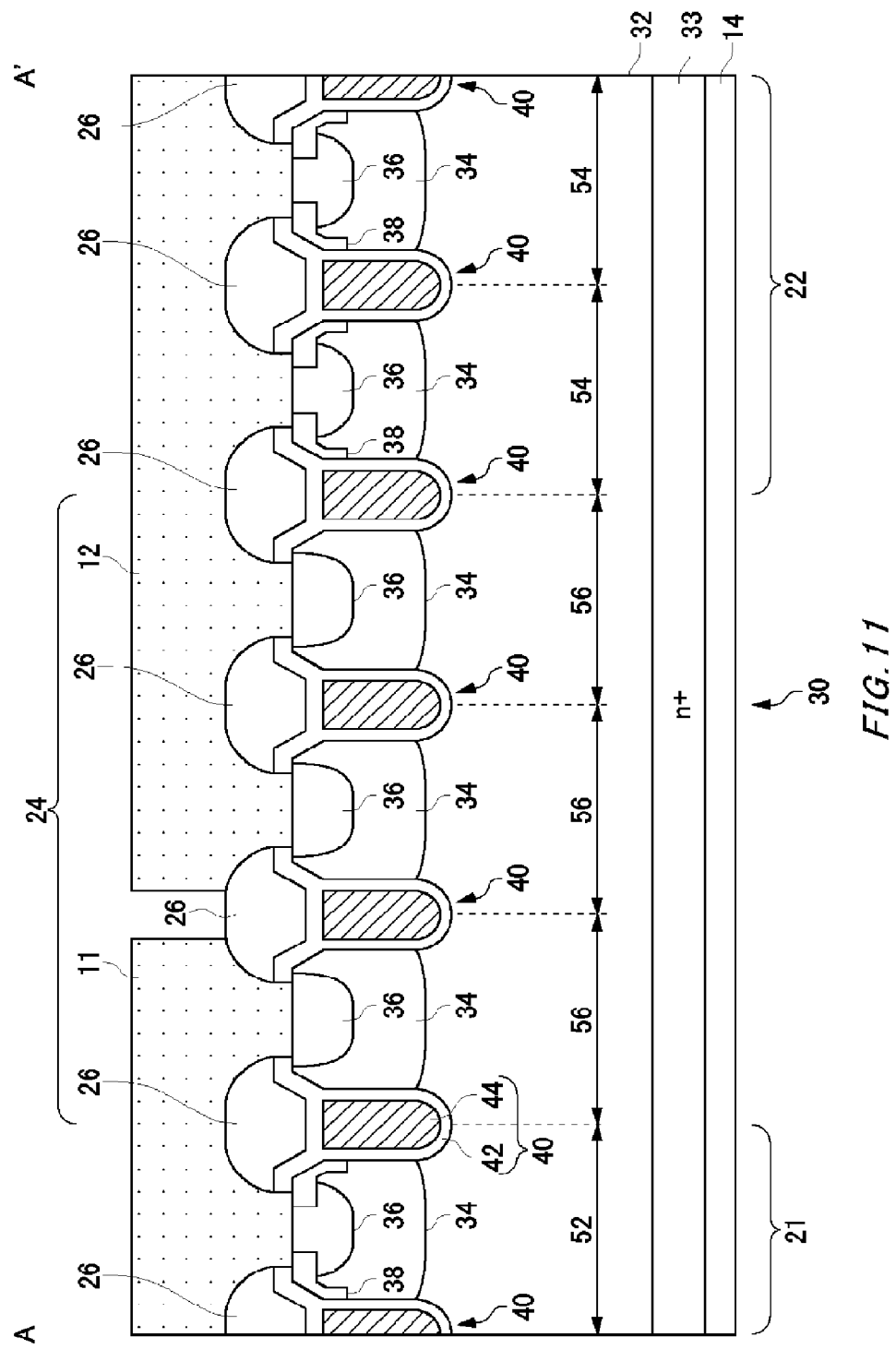
FIG. 11 shows another example of the cross section A-A' in FIG. 1.

FIG. 11 shows another example of the cross section A-A' in FIG. 1. The semiconductor device 100 of the present example has a structure that is equivalent to the structure shown in FIG. 5 but the additional electrode 50 is removed therefrom. Such a structure also allows the current flowing into the intermediate region 24 to be extracted via the intermediate cells 56 while separating the main body region 21 from the current detecting region 22 without having an ineffective region.

Figure 12:
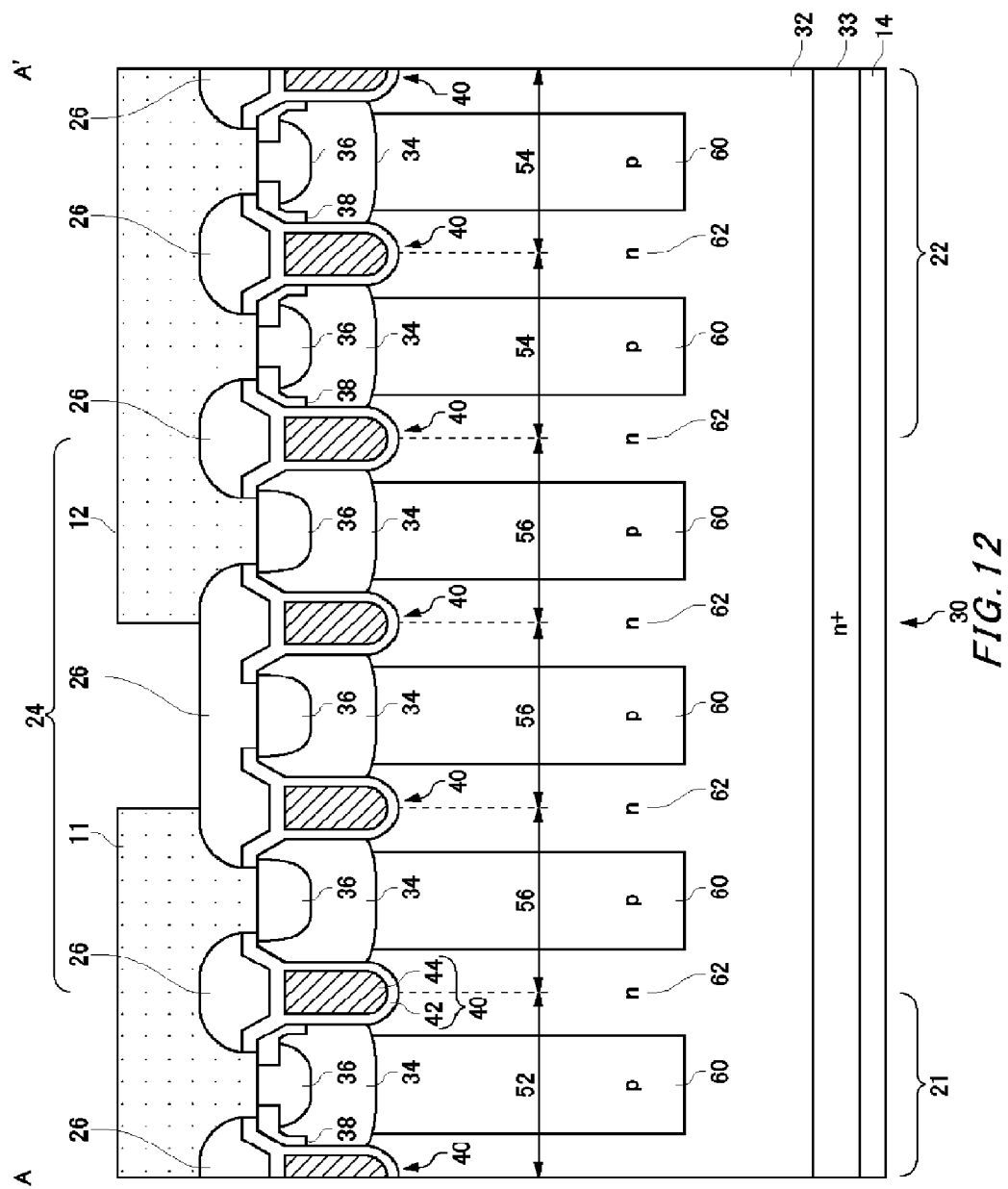
FIG. 12 shows another example of the cross section A-A' in FIG. 1.

FIG. 12 shows another example of the cross section A-A' in FIG. 1. The semiconductor device 100 of the present example has a structure that is equivalent to the structure shown in FIG. 10 but additionally has the column 60 and the column 62. Such a structure also allows keeping the charge balance of impurities in the p-type and n-type columns in superjunction while separating the main body region 21 from the current detecting region 22.

Figure 13:
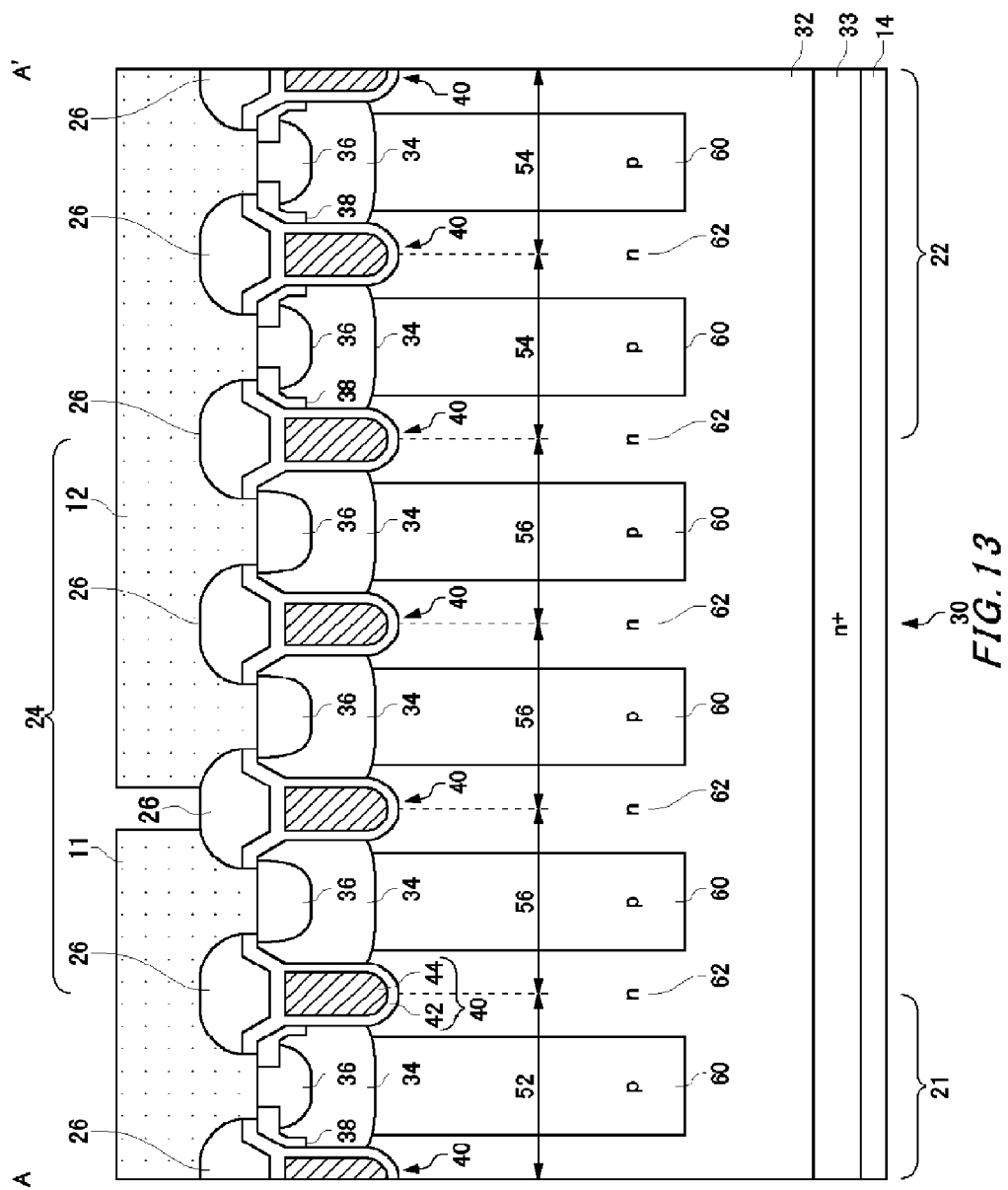
FIG. 13 shows another example of the cross section A-A' in FIG. 1.

FIG. 13 shows another example of the cross section A-A' in FIG. 1. The semiconductor device 100 of the present example is a structure that is equivalent to the structure shown in FIG. 11 but additionally has the column 60 and the column 62. Such a structure also allows keeping the charge balance of impurities in the p-type and n-type columns in superjunction while separating the main body region 21 from the current detecting region 22.

Figure 14:
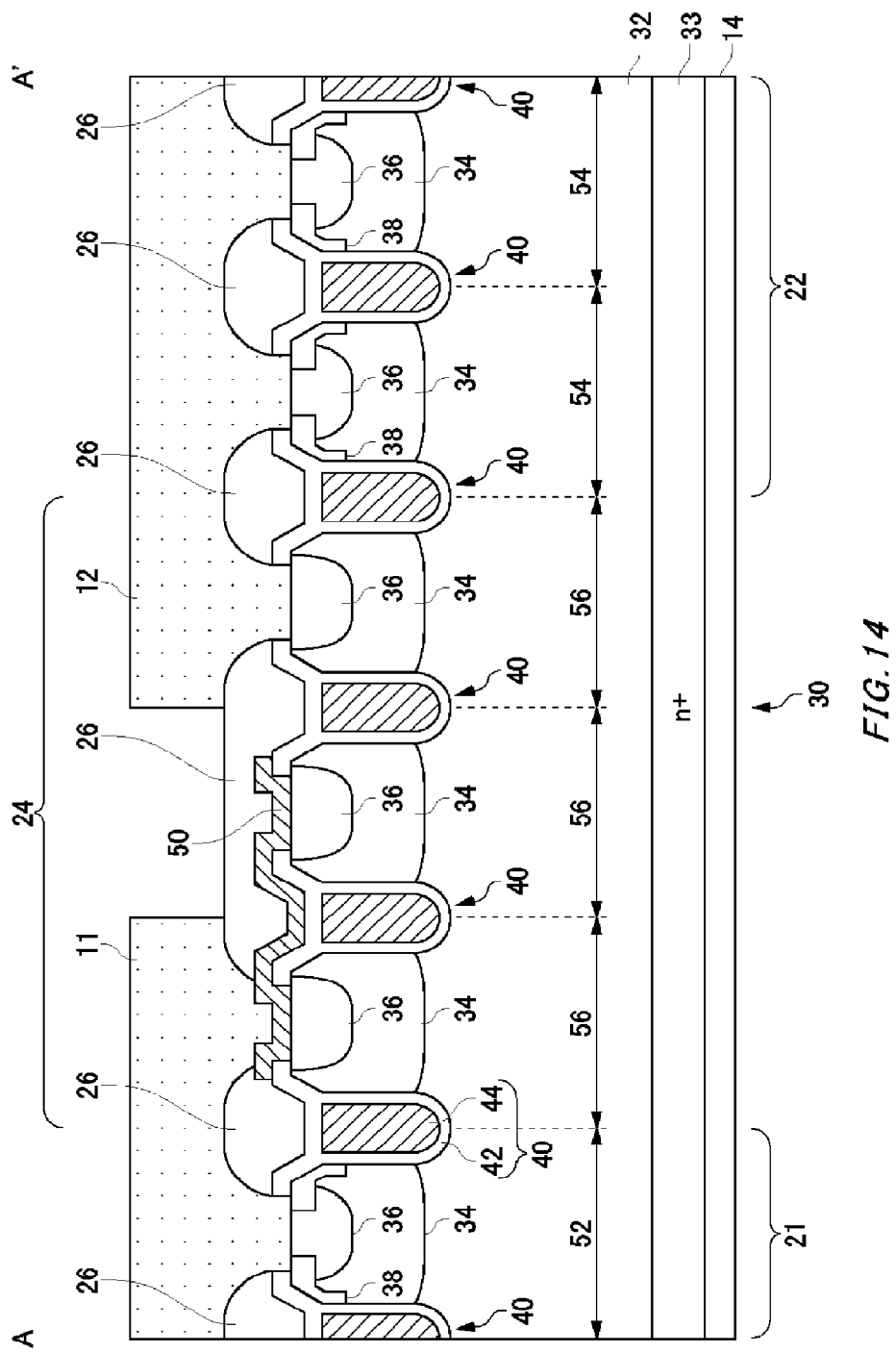
FIG. 14 shows another example of the cross section A-A' in FIG. 1.

FIG. 14 shows another example of the cross section A-A' in FIG. 1. Except for the position of the additional electrode 50, the semiconductor device 100 of the present example has the same structure as that of the semiconductor device 100 shown in any one of FIG. 1 to FIG. 9.

The additional electrode 50 of the present example is electrically connected to the source electrode 11. In this case, the current that flows into the intermediate region 24 flows into the source electrode 11 via the intermediate cell 56 and the additional electrode 50. Such a structure also makes it possible to suppress the current in the intermediate region 24 flowing into the current detecting region 22, so that the reverse breakdown voltage can be enhanced.

The additional electrode 50 may be formed below part of the source electrode 11. For example, the additional electrode 50 may be formed to extend to the intermediate cell 56 below the source electrode 11 and may not extend to the operation cell 52. Also, the additional electrode 50 may be formed below the entire source electrode 11.

Figure 15:
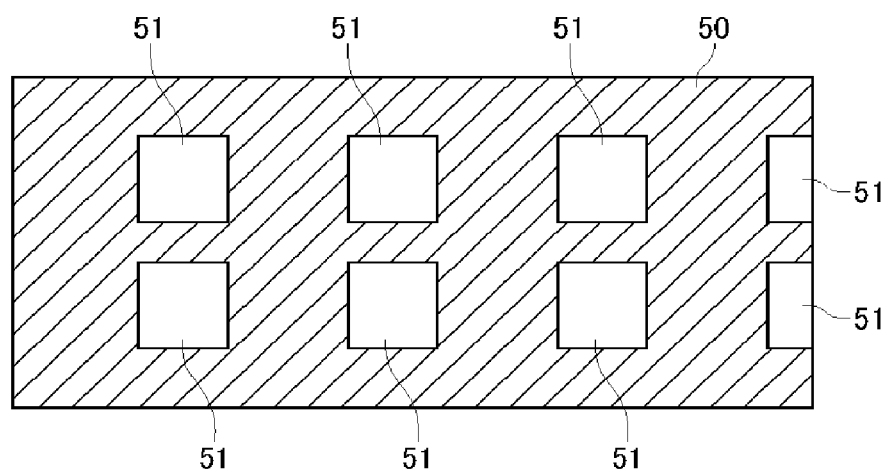
FIG. 15 is a top view of one example of the shape of an additional electrode 50.

FIG. 15 shows a top view of one example of the shape of the additional electrode 50. FIG. 15 illustrates a partial view of the vicinity of an end of the additional electrode 50. The additional electrode 50 of the present example has one or more opening portions 51 that penetrate the additional electrode 50 from the upper surface to the lower surface thereof. The opening portion 51 is formed in a region of the additional electrode 50, and the region overlaps the current detecting electrode 12 (or the source electrode 11). The inside of the opening portion 51 may be filled with the interlayer insulating film 26.

Providing the opening portion 51 in the additional electrode 50 partially reduces the cross section area of the additional electrode 50. This can adjust the electric resistance of the additional electrode 50 in the direction parallel to and in the direction perpendicular to the upper surface of the semiconductor substrate 30. Consequently, the current value of the detection target current that is caused to flow to the outside can be adjusted. The opening portions 51 may be arranged at equal intervals on the upper surface of the additional electrode 50. Also, the opening portion 51 may be arranged above the trench portion 40.

Figure 16:
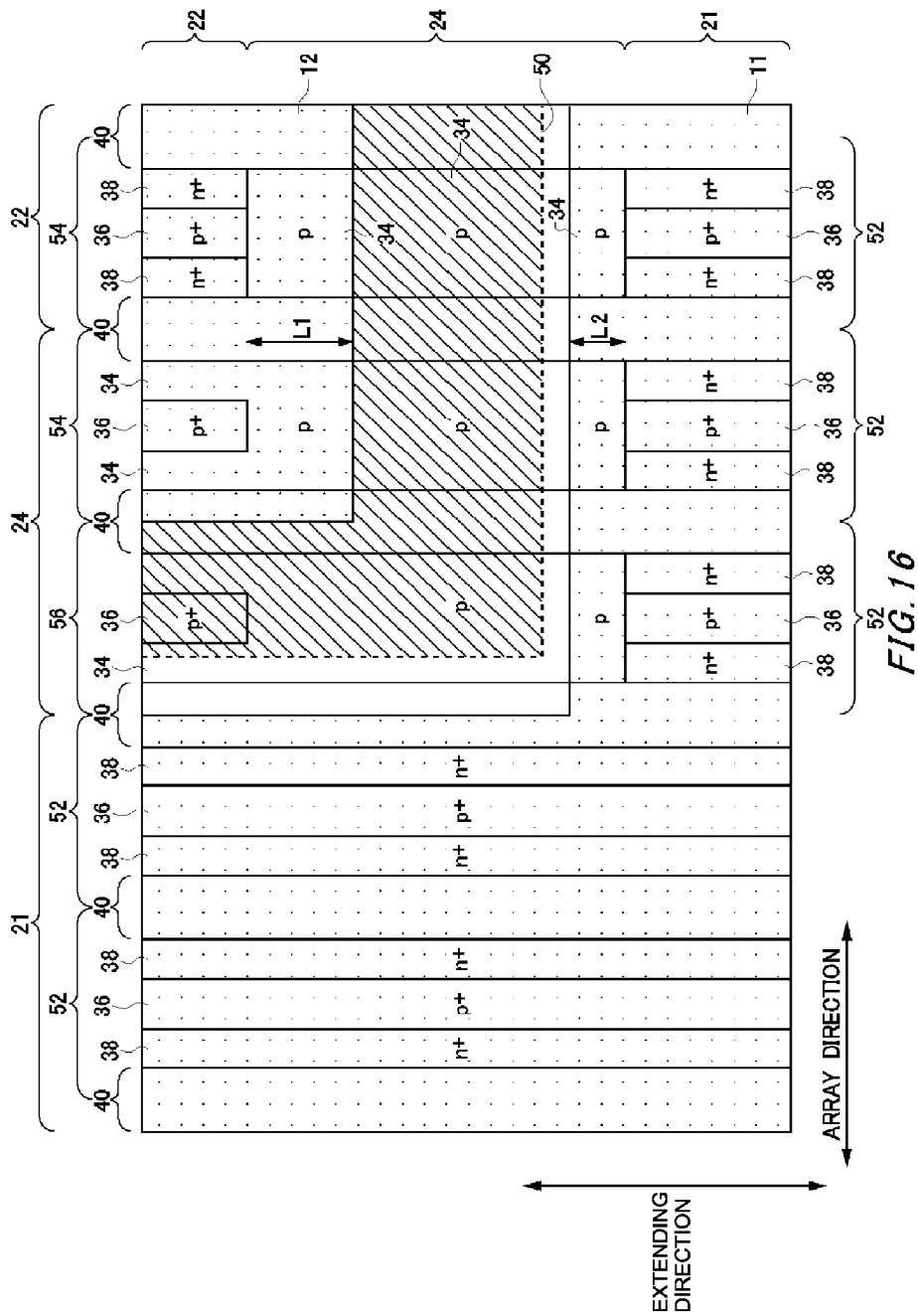
FIG. 16 is an enlarged schematic view of part B near a corner of a current detecting electrode 12 in FIG. 1.

FIG. 16 is an enlarged schematic view of the part B near a corner of the current detecting electrode 12 in the upper surface of the semiconductor device 100 in FIG. 1. FIG. 16 corresponds to the structure shown in FIG. 2. FIG. 16 shows the trench portion 40, the base region 34, the source region 38, the p$^+$-region 36, the additional electrode 50, the source electrode 11, and the current detecting electrode 12, and the rest of the structure is omitted.

Note that although the additional electrode 50 also extends between the source electrode 11 and the semiconductor substrate 30, the part where it overlaps the source electrode 11 is not shown in FIG. 16. Moreover, also in an embodiment, shown in FIG. 10 through FIG. 13, where the additional electrode 50 is not provided, the structure other than the additional electrode 50 is the same as that of the example in FIG. 16.

The plurality of trench portions 40 are arranged at constant intervals along a predetermined array direction in the main body region 21, the current detecting region 22, and the intermediate region 24. The respective trench portions 40 are provided to extend along a predetermined extending direction. As one example, when the main body region 21, the current detecting region 22, and the intermediate region 24 exist in the extending direction, the trench portion 40 is continuously formed across the main body region 21, the current detecting region 22, and the intermediate region 24.

The base region 34 is formed in the mesa region between the respective trench portions 40. However, in the main body region 21 and the current detecting region 22, the source region 38 and the p$^+$-region 36 are formed to extend in stripe shapes along the extending direction in the upper surface of the semiconductor substrate 30. Alternatively, the source region 38 and the p$^+$-region 36 may alternately be formed along the extending direction.

The intermediate region 24 is provided between the main body region 21 and the current detecting region 22 in both of the extending direction and the array direction. The p$^+$-region 36 may be not provided in part of the intermediate region 24. For example, in the mesa region included in the main body region 21, the current detecting region 22, and the intermediate region 24 in the extending direction, the p$^+$-region 36 is not provided in part of the intermediate region 24 in the extending direction. This separates the p$^+$-region 36 in the main body region 21 from the p$^+$-region 36 in the current detecting region 22.

Also, the source region 38 is not formed in the intermediate region 24. Accordingly, the source region 38 in the main body region 21 and the source region 38 in the current detecting region 22 are separated in the mesa region included in the main body region 21, the current detecting region 22, and the intermediate region 24 in the extending direction. In the mesa region included in the main body region 21, the current detecting region 22, and the intermediate region 24, a length L1 in the intermediate region 24 formed below the current detecting electrode 12 may be greater than a length 2 in the intermediate region 24 formed below the source electrode 11. This can reduce the area of the intermediate region 24 formed below the source electrode 11.

In the example of FIG. 16, in the extending direction, the end location of the p$^+$-region 36 in the current detecting region 22 aligns with the end location of the source region 38. In another example, in the extending direction, the p$^+$-region 36 in the current detecting region 22 may protrude more toward the intermediate region 24 side than the source region 38. For example, the p$^+$-region 36 may be formed to protrude more toward the intermediate region 24 side than the current detecting electrode 12 and/or may be formed to extend to the end of the additional electrode 50.

Figure 17:
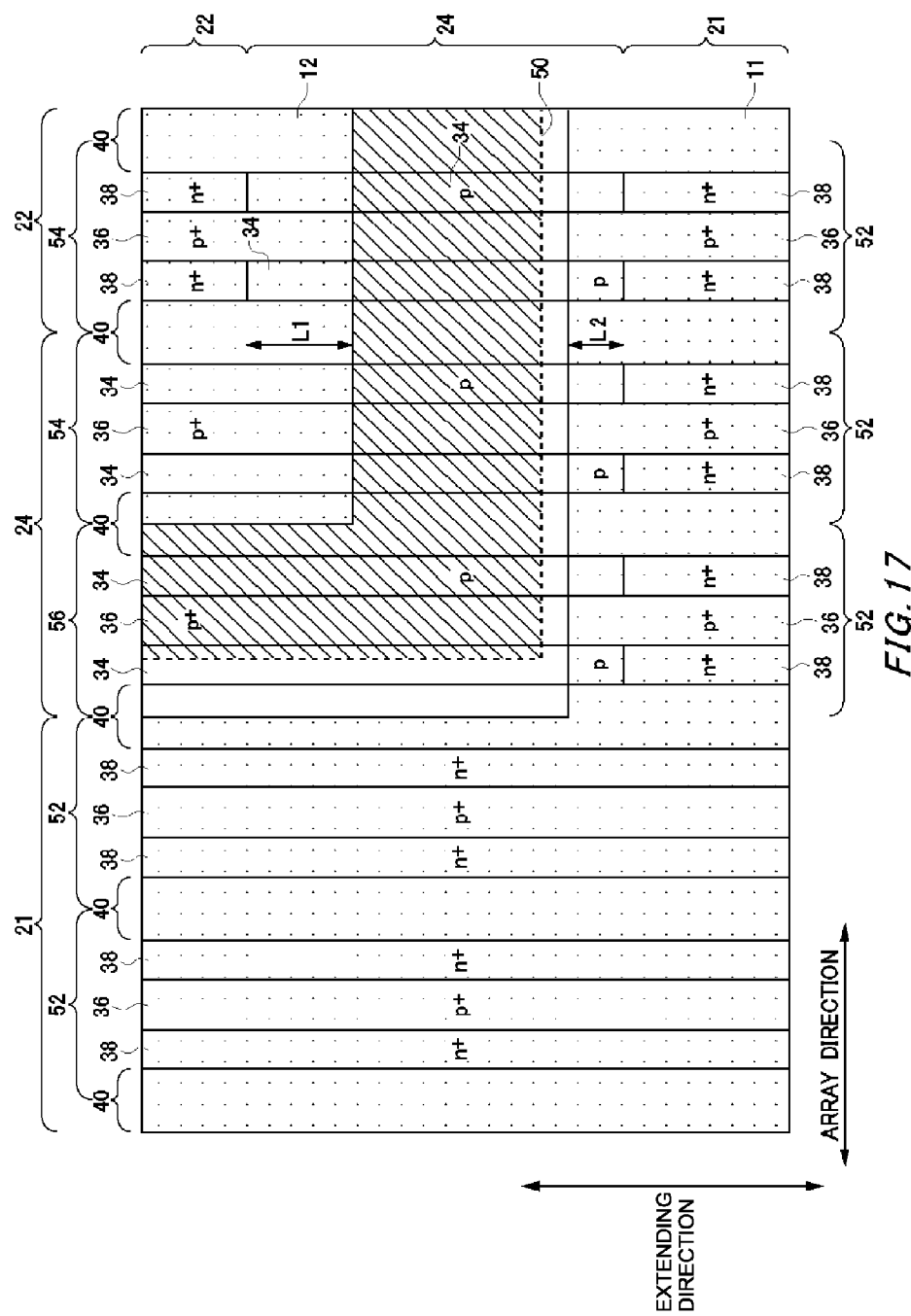
FIG. 17 is an enlarged schematic view of the part B near the corner of the current detecting electrode 12 in FIG. 1.

Furthermore, also in the intermediate region 24 provided between the main body region 21 and the current detecting region 22 in the array direction, the p$^+$-region 36 may be formed to protrude more toward the intermediate region 24 than the current detecting electrode 12 and/or may be formed to extend to the end of the additional electrode 50. However, the p$^+$-regions 36 are separate from the p$^+$-regions 36 in the main body region 21. Such a structure allows current in the intermediate region 24 to be efficiently extracted via the additional electrode 50. FIG. 17 is an enlarged schematic view of the part B near the corner of the current detecting electrode 12 in the upper surface of the semiconductor device 100 shown in FIG. 1. FIG. 17 corresponds to the structure shown in FIG. 2, as in the case with FIG. 16. FIG. 17 shows the trench portion 40, the base region 34, the source region 38, the p$^+$-region 36, the additional electrode 50, the source electrode 11, and the current detecting electrode 12, and the rest of the structure is omitted. FIG. 17 differs from FIG. 16 in that the p$^+$-region 36 is formed in the intermediate region 24. Also in the example of FIG. 17, effects similar to those in the example of FIG. 16 can be obtained.

While the embodiment(s) of the present invention has (have) been described, the technical scope of the invention is not limited to the above described embodiment(s).

It is apparent to persons skilled in the art that various alterations and improvements can be added to the above-described embodiment(s).

It is also apparent from the scope of the claims that the embodiments added with such alterations or improvements can be included in the technical scope of the invention.

Note that the embodiments according to the present invention describe a trench gate structure having the gate insulating film 42 formed on the inner wall of the trench and the electrode unit 44 covered with the gate insulating film 42 provided in the trench portion 40. Yet, the present invention may be applied to a planar gate structure including the base region selectively arranged in the surface layer of the semiconductor substrate, the source region selectively arranged in the base region, the gate insulating film arranged on the surface of the semiconductor substrate, and the electrode unit arranged on the gate insulating film.

Moreover, although the planar shapes of the base region 34 and the trench portion 40 are stripes as shown in FIG. 16 and FIG. 17, the planar shape of the base region 34 may be an island shape, the planar shape of the trench portion 40 may be a lattice shape arranged between the island shapes of the base regions 34, and the planar shape of the electrode unit 44 may be a lattice shape. Similarly, also in the above-mentioned planar gate structure, the planar shape of the base region may be an island shape, and the planar shape of the electrode unit may be a lattice shape arranged between the island shapes of the base regions. Note that when the base region is formed in an island shape, the planar shape of the p-type column is also arranged in an island shape.

EXPLANATION OF REFERENCES

11: source electrode; 12: current detecting electrode; 13: gate electrode; 14: drain electrode; 21: main body region; 22: current detecting region; 23: edge termination structure region; 24: intermediate region; 26: interlayer insulating film; 30: semiconductor substrate; 32: drift region; 33: drain region; 34: base region; 36: p$^+$-region; 38: source region; 40: trench portion; 42: gate insulating film; 44: electrode unit; 50: additional electrode; 51: opening portion; 52: operation cell; 54: current detecting cell; 56: intermediate cell; 60: column; 62: column; 100: semiconductor device

What is claimed is:

1. A semiconductor device comprising:
   a semiconductor substrate;
   a main body region having one or more operation cells formed inside the semiconductor substrate;
   a current detecting region having one or more current detecting cells formed inside the semiconductor substrate;
   an intermediate region formed between the main body region and the current detecting region and inside the semiconductor substrate;
   an upper surface side electrode formed above at least part of the main body region;
   a current detecting electrode that is formed above at least part of the current detecting region and is separate from the upper surface side electrode; and
   an additional electrode that is formed above at least part of the intermediate region and is connected to either the upper surface side electrode or the current detecting electrode.

2. The semiconductor device according to claim 1, wherein
   the operation cell and the current detecting cell each function as a transistor that causes a current to flow in a depth direction of the semiconductor substrate, and
   the intermediate region has an intermediate cell that functions as a diode that causes a current to flow in the depth direction of the semiconductor substrate.

3. The semiconductor device according to claim 2, wherein
   the additional electrode is formed to be thinner than the upper surface side electrode and the current detecting electrode.

4. The semiconductor device according to claim 2, wherein
   the operation cell, the current detecting cell, and the intermediate cell are formed at same intervals.

5. The semiconductor device according to claim 2, wherein formed inside the semiconductor substrate are:
   a first conductivity-type base region;
   a second conductivity-type drift region formed below the base region; and
   a plurality of trench portions that are formed to extend from an upper surface of the semiconductor substrate to below the base region and are arranged at same intervals, wherein
   a region between the respective trench portions functions as any one of the operation cell, the current detecting cell, or the intermediate cell,
   a second conductivity-type high concentration region is formed above the base region in the operation cell and the current detecting cell, and
   the high concentration region is not formed above the base region in the intermediate cell.

6. The semiconductor device according to claim 2, wherein
   the current detecting electrode is also formed above part of the intermediate cells.

7. The semiconductor device according to claim 2, wherein
   the upper surface side electrode is also formed above part of the intermediate cells.

8. The semiconductor device according to claim 7, wherein
   the number of the intermediate cells formed below the current detecting electrode is equal to or larger than the number of the intermediate cells formed below the upper surface side electrode.

9. The semiconductor device according to claim 1, wherein the additional electrode is connected to the current detecting electrode, and the additional electrode is formed below the entire current detecting electrode.

10. The semiconductor device according to claim 1, wherein the additional electrode is connected to the upper surface side electrode, and the additional electrode is formed below part of the upper surface side electrode.

11. The semiconductor device according to claim 1, wherein the additional electrode has an opening portion.

12. The semiconductor device according to claim 1, wherein formed inside the semiconductor substrate are:

a first conductivity-type base region;

a second conductivity-type drift region formed below the base region;

a plurality of trench portions that are formed to extend from an upper surface of the semiconductor substrate to below the base region and are arranged at same intervals; and a first conductivity-type column and a second conductivity-type column that are alternately arranged inside the drift region.

13. A semiconductor device comprising:

a semiconductor substrate;

a main body region having one or more operation cells formed inside the semiconductor substrate;

a current detecting region having one or more current detecting cells formed inside the semiconductor substrate;

an intermediate region having one or more intermediate cells formed between the main body region and the current detecting region and inside the semiconductor substrate;

an upper surface side electrode formed above at least part of the main body region; and a current detecting electrode that is formed above at least part of the current detecting region and is separate from the upper surface side electrode, wherein the operation cell, the current detecting cell, and the intermediate cell are arranged at same intervals, the operation cell and the current detecting cell each function as a transistor that causes a current to flow in a depth direction of the semiconductor substrate, and the intermediate cell functions as a diode that causes a current to flow in the depth direction of the semiconductor substrate.

* * * * *